United States Patent

Alers et al.

Patent Number: 6,060,406
Date of Patent: May 9, 2000

[54] MOS TRANSISTORS WITH IMPROVED GATE DIELECTRICS

[75] Inventors: Glen B. Alers, Santa Cruz, Calif.; Robert McLemore Fleming, Chatham, N.J.; Lynn Frances Schneemeyer, Westfield, N.J.; Robert Bruce Van Dover, Maplewood, N.J.

[73] Assignee: Lucent Technologies Inc., Murray Hill, N.J.

[21] Appl. No.: 09/086,252

[22] Filed: May 28, 1998

[51] Int. Cl.⁷ .................................................. H01L 21/31
[52] U.S. Cl. .................................. 438/785; 438/287
[58] Field of Search ........................... 438/287, 216, 438/261, 785

[56] References Cited

U.S. PATENT DOCUMENTS

| | | | |
|---|---|---|---|
| 4,789,645 | 12/1988 | Calviello et al. | 438/167 |
| 5,552,337 | 9/1996 | Kwon et al. | 438/396 |
| 5,677,015 | 10/1997 | Hasegawa | 427/576 |
| 5,963,810 | 10/1999 | Gardner et al. | 438/287 |

*Primary Examiner*—John F. Niebling
*Assistant Examiner*—John Murphy

[57] ABSTRACT

The specification describes silicon MOS devices with gate dielectrics having the composition $Ta_{1-x}Al_xO_y$, where x is 0.03–0.7 and y is 1.5–3, $Ta_{1-x}Si_xO_y$, where x is 0.05–0.15, and y is 1.5–3, and $Ta_{1-x-z}Al_xSi_zO_y$, where 0.7>x+z>0.05, z<0.15 and y is 1.5–3. By comparison with the standard $SiO_2$ gate dielectric material, these materials provide improved dielectric properties and also remain essentially amorphous to high temperatures. This retards formation of $SiO_2$ interfacial layers which otherwise dominate the gate dielectric properties and reduce the overall effectiveness of using a high dielectric material.

9 Claims, 4 Drawing Sheets

MOS TRANSISTORS WITH IMPROVED GATE DIELECTRICS

FIELD OF THE INVENTION

The invention relates to improved gate dielectric structures for increasing the gate capacitance in MOS transistor devices.

BACKGROUND OF THE INVENTION

As the size shrinks and speed of silicon devices increases, current leakage and other reliability problems increase. In MOS devices, small device dimensions, high speed performance, and low operating voltages are primary issues facing the continued development of improved devices. With a given budget for operating voltages the main option for the device designer is a trade-off between low power and high speed. The operating voltage scales with device dimensions which are relatively fixed for the current generation of technology. Thus the most promising option left for device improvement is to increase the coupling ratio by increasing the gate capacitance.

The main options for increasing the gate capacitance are to reduce the gate dielectric thickness or to alter the dielectric properties of the gate dielectric material. Device and process designers to date have recognized that as the gate dielectric thickness shrinks, the potential for leakage and other electrical defects increases. Thus the quality of the dielectric material used is important. The highest quality material so far developed in silicon technology for low defects and for low surface state density is $SiO_2$. An important advantage of $SiO_2$ is that it can be grown from the silicon substrate. It is well known that grown oxides tend to have fewer defects, e.g. pinholes, than deposited materials. Thus $SiO_2$ has persisted as the dielectric material of choice in most silicon device structures.

In spite of the popularity of $SiO_2$ as a dielectric material, efforts continue in a search for new dielectric materials. The use of $Ta_2O_5$ as a dielectric has been proposed for MOSFETs (see Youichi Momiyama et al, "Ultra-Thin $Ta_2O_5/SiO_2$ Gate Insulator with TiN Gate Technology for 0.1 μm MOSFETs", 1997 Symposium on VLSI Technology Digest of Technical Papers, pp. 135,136. This material has also been proposed for stacked and trench capacitors in DRAM structures (see Tomonori Aoyama et al, "Leakage Current Mechanism of Amorphous and Polycrystalline $Ta_2O_5$ Films Grown by Chemical Vapor Deposition", J. Electrochem. Soc., Vol. 143, No. 3, pp. 977–983, March 1996. The formula $Ta_2O_5$ represents the most common stoichiometric tantalum oxide, but this material, when deposited by most thin film deposition techniques, is often not stoichiometric. Therefore it is frequently referred to as $TaO_x$ which is the generic reference used in this description. The oxygen content x will typically be a value between 1.5 and 3.

While there is interest in $Ta_2O_5$ as a gate material it has been found to be incompatible with conventional silicon device processing. The gate dielectric in e.g. silicon gate device fabrication is exposed to heating steps at temperatures of the order of 850° C. and above. These temperatures are required for annealing and drive in of the source/drain implant. The conventional gate dielectric material, $SiO_2$, easily withstands these temperatures, and remains amorphous to temperatures as high as 1100° C. However, $TaO_x$ crystallizes at a temperature of approximately 650–700° C. In the crystal form, $TaO_x$ is not suitable for high performance device fabrication because of the formation of a substantial $SiO_2$ interfacial layer at the surface of the silicon substrate during high temperature processing. The excessively thick $SiO_2$ layer limits the objective of having a specific capacitance, C/A, material for the gate.

Crystallization of the $Ta_2O_5$ can also lead to non-uniformities in the capacitance on a length scale due to variations in the density of grain boundaries and inhomogeneities from gate to gate leading to unacceptable variations in threshold voltage in a given integrated circuit.

A modified form of $TaO_x$, Ta—Al—O, has been proposed for capacitor structures. See Nomura et al, U.S. Pat. No. 4,602,192. However, it has not been used in MOS transistor gate structures and there is no indication that it is compatible with the high temperature conditions required in the fabrication of these devices.

Use of Ta—Al—O has also been described in connection with thin film transistors. See Fujikawa et al, J. Appl. Phys, 75, 2538 (1994). These structures typically do not use single crystal silicon substrates and there is no indication of the electrical performance of a Ta—Al—O/silicon interface. Moreover, the devices were processed at temperatures well below those encountered in the process of this invention.

SUMMARY OF THE INVENTION

We have developed a new MOS gate structure, with improved dielectric properties, using Ta—Al—O or Ta—Si—O as the gate dielectric material. We have discovered that MOS transistor gates with these materials have exceptional electrical properties and these properties are not degraded by high temperature processing. Even after high temperature anneal, these materials have low leakage currents, show relatively little growth of interfacial $SiO_2$, and thus have high specific capacitance with low interface state density. The dielectric properties of these MOS gates are substantially improved over conventional silicon gate structures and allow new options for MOS device designers. Use of these gate dielectric materials is fully compatible with state of the art silicon device processing, and they have low defect potential comparable to that of $SiO_2$ but with a substantially higher K.

DETAILED DESCRIPTION

Figure 1:
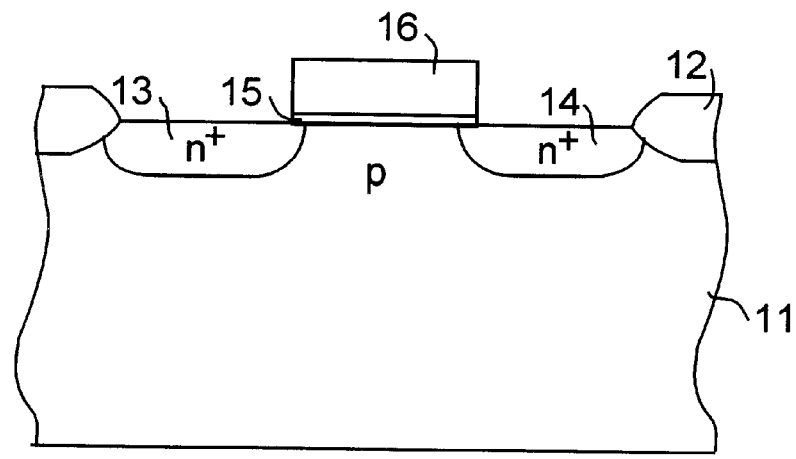
FIG. 1 is a schematic diagram of a typical insulated gate field effect transistor device.

Referring to FIG. 1, the essential elements of an insulated gate field effect transistor device are illustrated and include silicon substrate 11, source 13 and drain 14. These are shown as n-type regions for an n-channel device, but may also be p-type for CMOS devices. The field oxide is shown at 12, and the gate structure comprises gate dielectric 15 and gate conductor 16. Typically the gate conductor is polysilicon although other conductive materials, notably TiN or TaN, may also be used.

Figure 2:
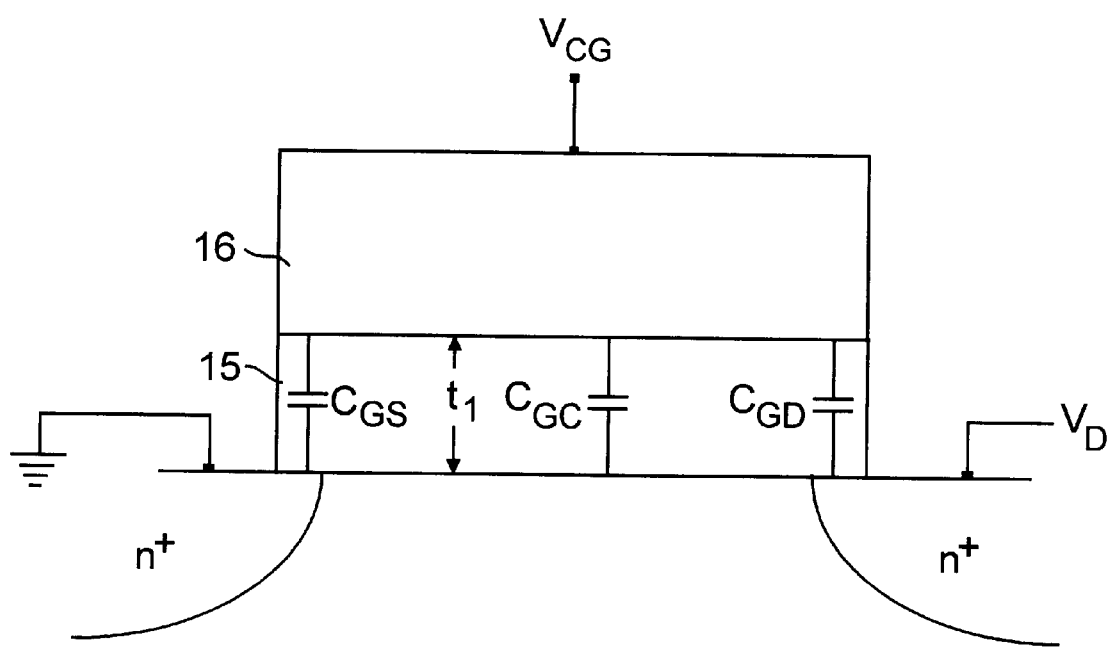
FIG. 2 is an enlarged view of the gate structure of FIG. 1.

The gate structure of FIG. 1 is shown in detail in FIG. 2. The important parameters are designated in the figure and relate to one another according to the following:

The voltage on the gate is:

$$\text{Equation (1): } V_G = \frac{C_{GD} \times V_D}{C_{GD} + C_{GS} + C_{GC}}$$

where $C_{GD}$ is the capacitance between the gate and the drain, $V_D$ is the drain voltage, $C_{GS}$ is the capacitance between the gate and the source, $C_{GC}$ is the capacitance between the gate and the substrate, and $V_G$ is the gate voltage.

It is desirable that the coupling between the gate and the channel of the substrate be high, therefore the $C_{GC}$ term in equation (1) should be large. This capacitance is determined by:

$$\text{Equation (2): } C_{GC} \approx \frac{\varepsilon_i}{t_1} \times A$$

where $\varepsilon_i$ is the dielectric constant for the insulating layer between the gate and the substrate, $t_1$ is the thickness of the insulating layer, and A is the gate area.

In state of the art device technology the thickness of the gate dielectric $t_1$ is generally optimized, i.e. it cannot practically be reduced further. Consequently, the only remaining option for improving gate performance is to increase the dielectric constant of the insulated gate material.

Many insulating materials are available with dielectric constants higher than that of the commonly used insulator, $SiO_2$. $SiO_2$ has a dielectric constant $\varepsilon_i$ of 3.9. Among other candidates $Ta_2O_5$ is attractive, with a $\varepsilon_i$ of 25. This means, inter alia, that a 100 Angstrom $Ta_2O_5$ gate oxide should have dielectric properties approximately equivalent to a 20 Angstrom $SiO_2$ layer, or that a 30 Angstrom $Ta_2O_5$ gate oxide should be approximately equivalent to a 5 Angstrom $SiO_2$ layer. The extra thickness for an equivalent dielectric allows considerably more latitude and control for the process designer. While a $SiO_2$ gate dielectric with a thickness of 20 Angstroms may have excessive leakage due to quantum-mechanical tunneling, leading to reduced reliability of the device, a 100 Angstrom $Ta_2O_5$ generally will not have the same problems.

However, when $TaO_x$ is substituted for $SiO_2$ in a state of the art self-aligned silicon gate process the capacitance of the $TaO_x$ undergoes rapid degradation at temperatures in the range 800° C. and above. This is believed to be due to the inevitable formation of native silicon oxide on the silicon substrate during high temperature process steps. The term high temperature in this context means temperatures where silicon readily oxidizes, i.e. greater than 800° C. While formation of some native oxide is essentially unavoidable in silicon processing, it was found that with an interface that is nominally $Si/TaO_x$, a very substantial $SiO_2$ layer grows at temperatures of 800° C. and above. The silicon oxide growth is believed to be enabled by the morphology of the $TaO_x$ layer. Below 600° C., $TaO_x$ remains essentially amorphous. At approximately 650–700° C., $TaO_x$ crystallizes, and the crystal form of $TaO_x$ does not withstand the high temperature processing required for Si IGFET device manufacture. These effects are known and were reported on in detail by Kim et al, Jpn. J. Appl. Phys. Vol. 33 (1994) Pt. 1, No. 12A, pp. 6691–6698.

Figure 3:
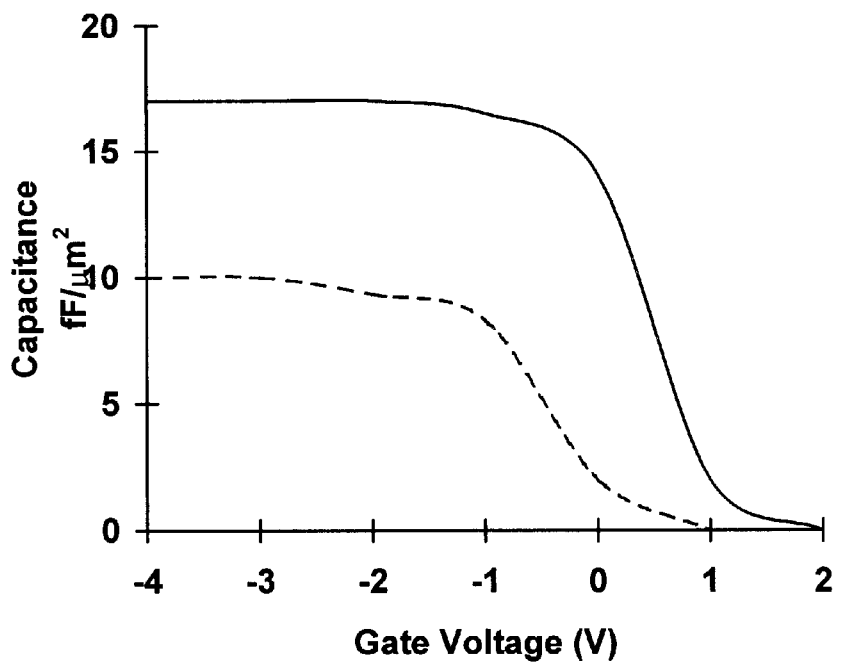
FIG. 3 is a C-V plot for the dielectric gate material of the invention.

The degradation of a $TaO_x$ dielectric layer at high temperatures is illustrated in FIG. 3. FIG. 3 shows the effect of an 800° C. anneal on the C-V (capacitance vs. voltage) curve of an MOS $TaO_x$ dielectric. The solid curve gives data for the unannealed dielectric, and the dashed curve gives data for the dielectric layer after an 800° C. anneal. The decrease in capacitance in the accumulation regime is quite large, i.e. from 17 fF/$\mu m^2$ before annealing, to 10 fF/$\mu m^2$ after annealing. This decrease in capacitance is highly undesirable and is associated with crystallization of the $TaO_x$.

As a consequence of excessive $SiO_2$ growth, which occurs during the anneal just described, the goal of the device design is largely defeated. In gate capacitors with less than 20 fF/$\mu m^2$, the capacitance of a $Ta_2O_5$ film can be increased with crystallization of the $Ta_2O_5$ due to the slightly higher dielectric constant of crystalline $Ta_2O_5$ relative to amorphous. However, obtaining a capacitance larger than 20 fF/$\mu m^2$ is still limited by the formation of the interfacial $SiO_x$ region during high temperature processing. If the device design calls for a $Ta_2O_5$ gate dielectric with a thickness of 100 Angstroms, i.e. a capacitance of approximately 22 fF/$\mu m^2$, the final gate dielectric may actually include e.g. 20 Angstroms or more of $SiO_2$. The series capacitance of the $SiO_2$, 17 fF/$\mu m^2$, dominates the gate dielectric properties. For the dual dielectric layer, the capacitance equals $(C/A)_D = [(C_1/A_1)^{-1} + (C_2/A_2)^{-1}]^{-1}$, where $C_1$ and $A_1$ are properties of the $TaO_x$ layer and $C_2$ and $A_2$ are properties of the $SiO_2$ layer. The value $(C/A)_D = 9.6$ fF/$\mu m^2$.

According to the invention, $TaO_x$ is modified by the inclusion of substantial amounts of Al or Si. The addition of Al or Si to $TaO_x$ has been found to increase the crystallization temperature of the oxide to the point where it will withstand high temperature silicon device processing conditions.

To demonstrate the effect of Al and Si additions, thin films of Ta—Al—O and Ta—Si—O were deposited on HF-etched single crystal silicon substrates. The films were prepared by off-axis co-sputtering using the following procedure.

Silicon substrates were mounted onto Al sample holders using Ta clips for thermal and electrical contact. The samples were positioned 5.5 cm from the 2-inch diameter Ta-metal magnetron sputter gun target, and 5.5 cm. from the 2-inch diameter Al-metal magnetron sputter gun target. The two magnetron sputter guns are positioned with targets facing each other. The sample is positioned so that its plane is parallel to the line connecting the centers of the two magnetron targets, and displaced 3.5 cm. from that line. The vacuum system was pumped to a pressure lower than $5 \times 10^{-6}$ Torr. Oxygen was introduced into the chamber at a rate of 10 sccm, with 15 sccm Ar carrier gas. The total chamber pressure was 30 mTorr. RF power to the substrate was adjusted to 10 W. The Ta gun was RF powered at 100 W and the Al gun was RF powered at 60 W. RF matching circuits for the RF power supplies were tuned for minimum reflected power. Deposition continued for 5 minutes which produced a film with a composition $Ta_{0.7}Al_{0.3}O_x$ and a thickness of approximately 600 Angstroms.

Films were also sputtered from a composite Ta—Al target using the following procedure.

A 2-inch diameter $Ta_{0.9}Al_{0.1}$ composite sputtering target was mounted in the magnetron sputtering gun. A silicon substrate was mounted on the sample holder using Ta clips. The sample was positioned facing the target at a distance of 9 cm. The chamber was pumped to a pressure below $1 \times 10^{-6}$ Torr. The silicon substrate was heated to 300° C. Oxygen was admitted at a flow rate of 3 sccm with 5 sccm of Ar carrier gas. Pulsed DC power at 200 W was applied to the composite target gun. Pulse rate was 122 kHz with a 20% duty cycle.

Deposition continued for 2 minutes and produced an 8% Al—TaO$_x$ film with a thickness of 500 Angstroms.

Films with a composition Ta—Si—O are produced using the same procedure except that Si is substituted for Al in the targets.

While these techniques produce acceptable results, other suitable thin film deposition techniques may be used. For example, chemical vapor deposition (CVD) is widely used in silicon processing. A suitable process for depositing heavily doped TaO$_x$ is by low pressure chemical vapor deposition (LPCVD). The recommended temperature is in the range 300–500° C. and preferably approximately 375–430° C. The recommended pressure is in the range 50–200 mTorr and preferably approximately 75–150 mTorr. Precursors for CVD deposition are selected from those known in the art, e.g. Ta(OC$_2$H$_5$)$_5$, AlCl$_3$, SiCl$_4$, SiH$_4$, and O$_2$ in an argon carrier gas. Typical deposition rates are 30–100 Angstroms/min.

Mixed Al/Si compositions can be prepared using the above described techniques by simply using three sputtering targets in the first approach described, or a mixed target containing both Al and Si in the composite target sputtering example. In CVD processes the precursor gas materials comprise mixed Al and Si reagents.

Other possible deposition processes include, atomic layer deposition (epitaxy) (ALD), and jet vapor deposition. Anodization is widely used in Ta thin film technology but is less suitable for Ta—Al technology.

Coated silicon substrates prepared by the foregoing procedure were examined by x-ray diffraction to show the crystallization characteristics of the Ta—Al/Si—O$_x$ materials of the invention. The onset of crystallization of the thin film was indicated by the development of characteristic peaks in the diffraction pattern. Samples were annealed at the test temperature for 30 minutes in air. Samples that were sequentially annealed (e.g. 700° C., 750° C., . . . 825° C.) gave the same results as samples annealed in a single step (e.g. 825° C.). Results of this evaluation are given in FIG. 4, where T$_x$ is the maximum temperature at which the films remain amorphous, and is plotted against the atomic % substitution of Al and Si in Ta—O. Data is also given for Ge substitutions, which, as seen, are ineffective for the purposes of the invention.

Figure 5:
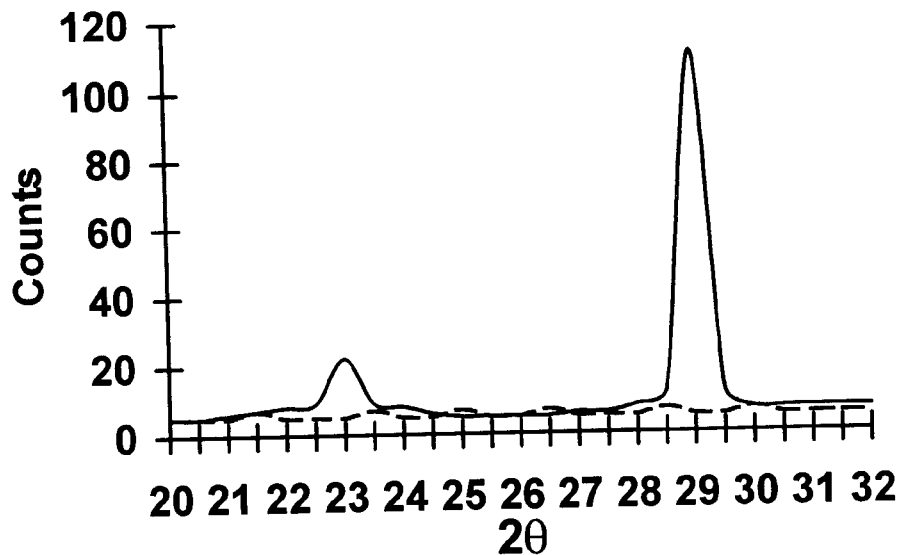
FIG. 5 is an x-ray diffraction pattern for a dielectric material of the invention.

FIG. 5 shows the θ-2θ diffraction pattern for a Ta$_{0.95}$Al$_{0.05}$O$_x$ sample after heating to 825° C. for 30 minutes in air (dashed curve), where no x-ray peaks are seen, and after 850° C. for 30 minutes in air (solid curve), where clear x-ray peaks prove the occurrence of crystallization. The peaks observed for the sample after the 850° C. anneal did not increase after a 900° C./30 minute anneal, thus establishing that crystallization is complete after the 850° C. treatment.

Figure 6:
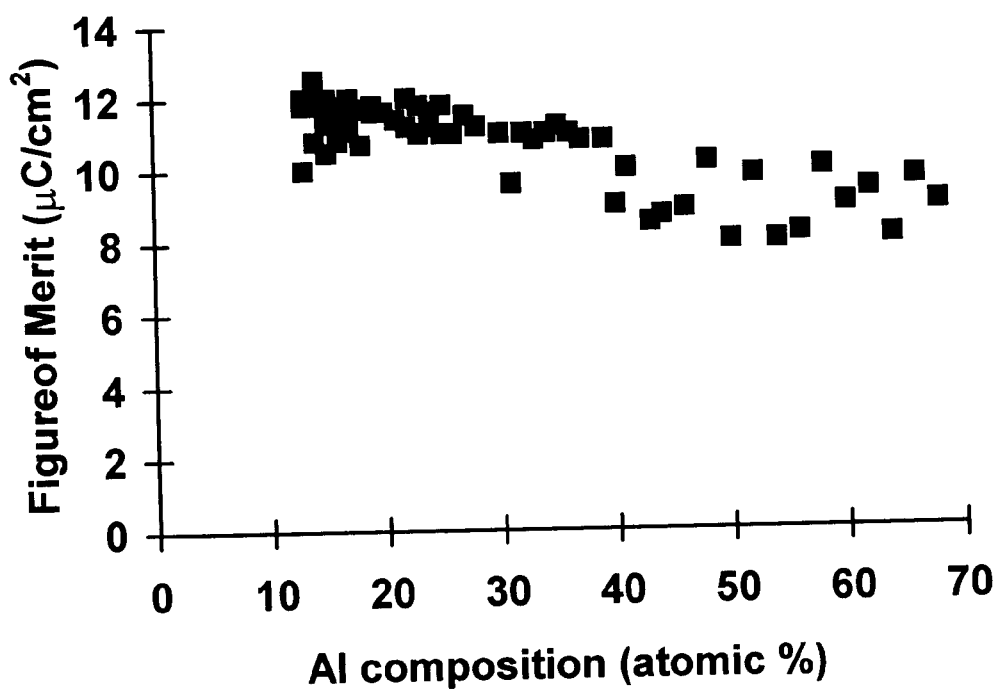
FIGS. 6 and 7 are plots of a Figure of Merit of dielectric performance for Ta—Al—O (FIG. 6) and Ta—Si—O (FIG. 7).
Figure 7:
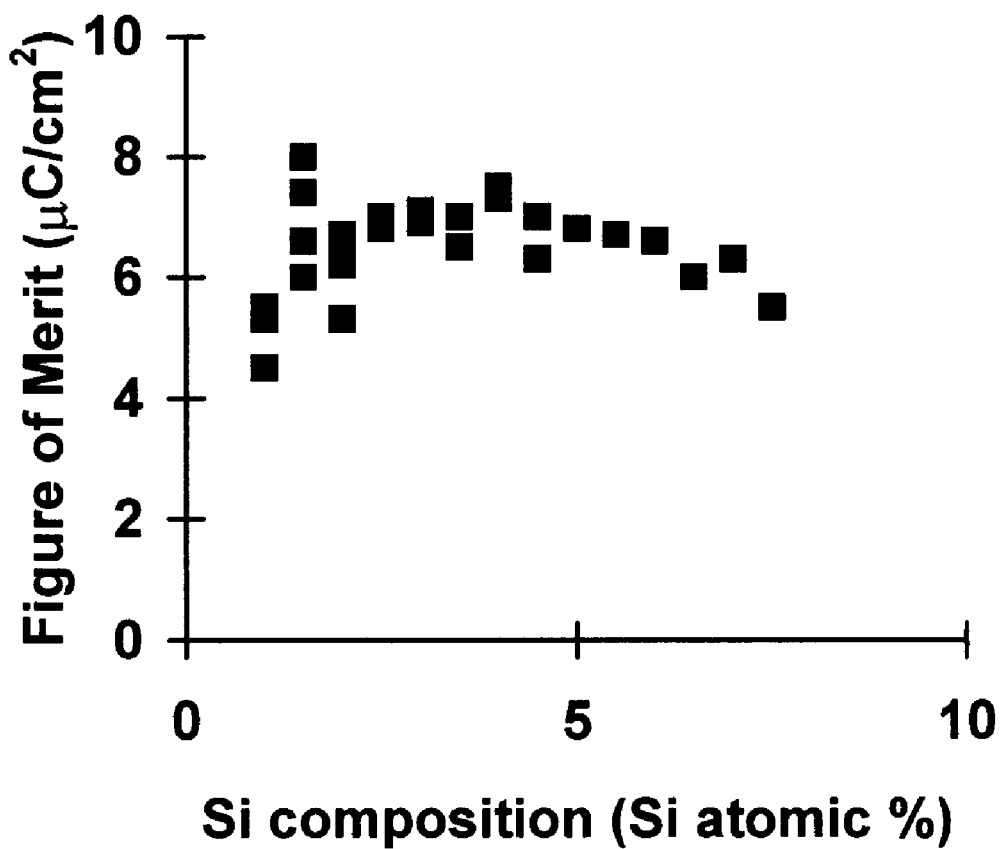

Studies were also made to determine the effect of these gate material modifications on the electrical performance of a gate dielectric. Measurements were made of the Figure of Merit vs. Al content in Ta—Al—O films. The Figure of Merit is defined as $\in\in_0 E_{br}$, where $\in$ is the dielectric constant, and E$_{br}$ is the breakdown voltage. The results of this investigation are given in FIG. 6. Similar data for Si additions is given in FIG. 7.

Figure 4:
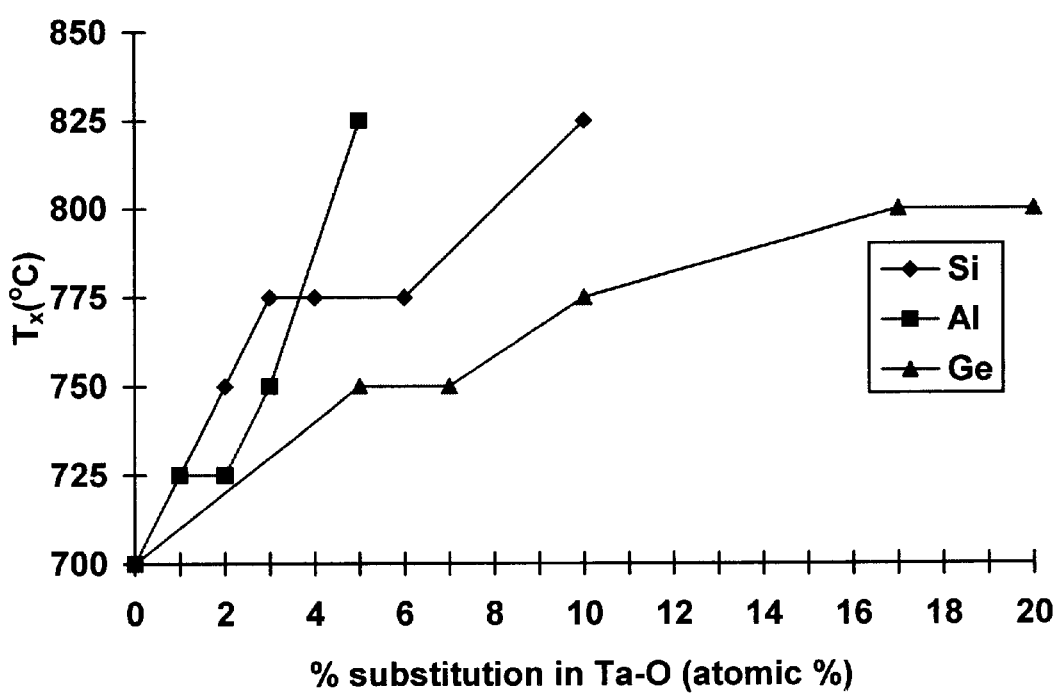
FIG. 4 is a plot showing the crystallization temperature for the gate dielectric materials of the invention.

Based on the data of FIGS. 4–7, the recommended range of atomic percent substitutions for Al is 3–70 percent, and preferably 5–40%. The data in FIG. 4 show that at atomic percent substitutions of 3% some benefits are obtained. At 5% and above, the films are expected to remain completely amorphous throughout the silicon device processing. The data given in FIG. 6 indicates that with additions as high as 70% the electrical properties of the modified oxide films are still relatively unaffected. For silicon substitutions, the recommended range is 5–15%. These compositions can be expressed as Ta$_{1-x}$Al$_x$O$_y$, where x is 0.03–0.7, and preferably 0.05–0.2, and y is 1.5–3; and Ta$_{1-x}$Si$_x$O$_y$, where x is 0.05–0.15, and y is 1.5–3.

These studies show that similar results are expected for compositions Ta$_{1-x-z}$Al$_x$Si$_z$O$_y$, where 0.70>x+z>0.05, and z<0.15.

The thickness of the gate dielectric layer in state of the art devices is in the range 5–100 Angstroms and preferably 10–60 Angstroms. Gate dielectrics having a Ta—Al—O or Ta—Si—O composition according to the invention and prepared by normal thin film techniques may in many cases have a very thin of native SiO$_2$ at the interface with the silicon substrate to reduce surface state density. Because of the considerations discussed earlier, the layer should be kept very thin, i.e. less than 15 Angstroms, which is characteristically the result of using the teachings of this invention.

Thereafter the gate electrode is deposited by a known technique, e.g. CVD or sputtering, to complete the MOS device. The gate material is typically polysilicon, which is widely used in silicon device processing. However, other gate electrode materials, notably TiN, WN, or WSi can also be used.

It will be evident from the foregoing that a significant advantage of the invention is that it can be integrated with conventional silicon device manufacturing processes in which one or more processing steps involve heating the silicon substrates or wafers to temperatures in excess of 850° C. Thus the invention in a principle embodiment can be described as a method for the manufacture of silicon MOS IGFET devices which method includes at least one step of heating the silicon substrate to a temperature of at least 850° C. A typical heating step in a conventional process is the source/drain implant anneal, used to activate and drive the implanted impurities. The heating step may have a duration of e.g. 5–60 minutes, or may be a rapid thermal anneal in which case the duration of the heating step will be substantially shorter.

The basic sequence of steps, the details of which are well known, is the following:

Grow field oxide and pattern field oxide to expose transistor sites (this operation may be a single step using a silicon nitride LOCOS process or may be an oxide growth and/or deposit step with a photoresist (PR) patterning step).

Clean silicon surface with a procedure that leaves passivating layer of either hydrogen or silicon oxide.

Deposit Ta—Al—O, Ta—Si—O, or Ta—Al—Si—O gate dielectric layer.

Deposit gate electrode layer (typically polysilicon evaporated or deposited by CVD).

Mask gate electrode layer and open source/drain windows (using PR).

Implant source and drain using the gate electrode as a mask (typically an arsenic implant for an n-channel device or a boron implant for a p-channel device).

Heat to a temperature of at least 850° C. (implant anneal and drive).

Deposit oxide (typically TEOS).

Define contact windows(PR).

Metallize to form electrical contacts.

As known to those skilled in the art, these (or a subset thereof) are the essential steps in a typical silicon MOS wafer fabrication operation. The source/drain implants may be into the bare silicon substrate or through a regrown oxide layer. In either case the mask for the source/drain implant is essentially the gate electrode. Other details of the process, such as forming sidewalls, LDD implant, cleaning operations, interlevel dielectric formation, multilevel metal interconnects, etc. are not important to the context of the invention.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Method for the manufacture of an MOS silicon device comprising the steps of:

a. forming a dielectric layer on a silicon substrate,
   b. forming a gate electrode on said dielectric layer, the invention characterized in the dielectric layer has a composition selected from the group consisting of: (1) $Ta_{1-x}Al_xO_y$, where x is 0.03–0.7 and y is 1.5–3, (2) $Ta_{1-x}Si_xO_y$, where x is 0.05–0.15, and y is 1.5–3, and (3) $Ta_{1-x-z}Al_xSi_zO_y$, where 0.7>x+z>0.05, z<0.15 and y is 1.5–3.

2. The method of claim 1 in which the dielectric layer has a composition $Ta_{1-x}Al_xO_y$, where x is 0.05–0.4.

3. The method of claim 1 wherein the dielectric layer has a thickness in the range 20–100 Angstroms.

4. The method of claim 1 wherein the gate electrode is polysilicon.

5. The method of claim 1 wherein the gate electrode is a material selected from the group consisting of TiN, WN and WSi.

6. Method for the manufacture of an MOS silicon device with an MOS gate and source and drain regions comprising the steps of:

a. forming a dielectric layer on a silicon substrate,
   b. forming a gate electrode layer on said dielectric layer,
   c. patterning said gate electrode layer to define the MOS gate electrode,
   d. implanting source and drain regions using said MOS gate electrode as a mask,
   e. heating the silicon substrate to a temperature of at least 850° C., the invention characterized in the dielectric layer has a composition selected from the group consisting of: (1) $Ta_{1-x}Al_xO_y$, where x is 0.03–0.7 and y is 1.5–3, (2) $Ta_{1-x}Si_xO_y$, where x is 0.05–0.15, and y is 1.5–3, and (3) $Ta_{1-x-z}Al_xSi_zO_y$, where 0.7>x+z>0.05, z<0.15 and y is 1.5–3.

7. The method of claim 6 in which the dielectric layer has a composition $Ta_{1-x}Al_xO_y$ where x is 0.05–0.4.

8. The method of claim 6 wherein the dielectric layer has a thickness in the range 20–100 Angstroms.

9. The method of claim 6 wherein the gate electrode is polysilicon.

* * * * *